(12) United States Patent  
Chang et al.

(10) Patent No.: US 7,770,141 B2  
(45) Date of Patent: Aug. 3, 2010

(54) COMPUTER RECORDING MEDIUM FOR STORING PROGRAM OF CHECKING DESIGN RULE OF LAYOUT

(75) Inventors: Chung-Chih Chang, Taichung County (TW); Chien-Chih Kuo, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 671 days.

(21) Appl. No.: 11/699,669

(22) Filed: Jan. 29, 2007  
(Under 37 CFR 1.47)

(65) Prior Publication Data

US 2008/0184178 A1 Jul. 31, 2008

(51) Int. Cl.  
*G06F 17/50* (2006.01)

(52) U.S. Cl. .................................. 716/5; 716/4; 716/11

(58) Field of Classification Search ...................... 716/4, 716/5, 6, 11  
See application file for complete search history.

(56) References Cited

U.S. PATENT DOCUMENTS

| | | | | |
|---|---|---|---|---|
| 4,893,170 | A * | 1/1990 | Tokuda et al. | 257/207 |
| 5,610,833 | A * | 3/1997 | Chang et al. | 716/11 |
| 5,998,226 | A * | 12/1999 | Chan | 438/10 |
| 6,011,911 | A | 1/2000 | Ho et al. | |
| 6,086,238 | A * | 7/2000 | Mehrotra et al. | 716/10 |
| 6,397,373 | B1 | 5/2002 | Tseng et al. | |
| 6,606,735 | B1 | 8/2003 | Richardson et al. | |
| 6,611,946 | B1 | 8/2003 | Richardson et al. | |
| 6,816,997 | B2 | 11/2004 | Teh et al. | |
| 2005/0257188 | A1* | 11/2005 | Kotani et al. | 716/21 |

* cited by examiner

*Primary Examiner*—Sun J Lin  
(74) *Attorney, Agent, or Firm*—Chun-Ming Shih

(57) ABSTRACT

A method for checking a design rule of layout and a computer readable recording medium for storing program thereof are provided. A layout comprising a plurality of layers is united so as to generate a flag layer to check the layout, through which any information about characters in the layout can be identified. Characters in the layout can be used in general command file to inspect the checking of the design rule for the purpose of saving time and manual effort.

18 Claims, 12 Drawing Sheets

```
TOPM11      = COPY ME11
NO_M11_BULK = BULK NOT INTERACT TOPM11
TOPM10      = ME10 INTERACT NO_M11_BULK
NO_M10_BULK = NO_M11_BULK NOT INTERACT TOPM10
TOPM9       = ME9 INTERACT NO_M10_BULK
NO_M9_BULK  = NO_M10_BULK NOT INTERACT TOPM9
TOPM8       = ME8 INTERACT NO_M9_BULK
NO_M8_BULK  = NO_M9_BULK NOT INTERACT TOPM8
TOPM7       = ME7 INTERACT NO_M8_BULK
NO_M7_BULK  = NO_M8_BULK NOT INTERACT TOPM7
TOPM6       = ME6 INTERACT NO_M7_BULK
NO_M6_BULK  = NO_M7_BULK NOT INTERACT TOPM6
TOPM5       = ME5 INTERACT NO_M6_BULK
NO_M5_BULK  = NO_M6_BULK NOT INTERACT TOPM5
TOPM4       = ME4 INTERACT NO_M5_BULK

TOPMET = ((((((TOPM4 OR TOPM5) OR TOPM6) OR TOPM7) OR TOPM8) OR
TOPM9) OR TOPM10) OR TOPM11)
```
— 510

```
COMM10 = (ME10 NOT INTERACT NO_M11_BULK) NOT TOPM10
COMM9  = (ME9 NOT INTERACT NO_M10_BULK) NOT TOPM9
COMM8  = (ME8 NOT INTERACT NO_M9_BULK) NOT TOPM8
COMM7  = (ME7 NOT INTERACT NO_M8_BULK) NOT TOPM7
COMM6  = (ME6 NOT INTERACT NO_M7_BULK) NOT TOPM6
COMM5  = (ME5 NOT INTERACT NO_M6_BULK) NOT TOPM5
COMM4  = (ME4 NOT INTERACT NO_M5_BULK) NOT TOPM4
```
— 520

```
TOPV10 = VI10 NOT INTERACT NO_M11_BULK
TOPV9  = (VI9 NOT INTERACT NO_M10_BULK) INTERACT NO_M11_BULK
TOPV8  = (VI8 NOT INTERACT NO_M9_BULK) INTERACT NO_M10_BULK
TOPV7  = (VI7 NOT INTERACT NO_M8_BULK) INTERACT NO_M9_BULK
TOPV6  = (VI6 NOT INTERACT NO_M7_BULK) INTERACT NO_M8_BULK
TOPV5  = (VI5 NOT INTERACT NO_M6_BULK) INTERACT NO_M7_BULK
TOPV4  = (VI4 NOT INTERACT NO_M5_BULK) INTERACT NO_M6_BULK
TOPV3  = VI3 INTERACT NO_M5_BULK

TOPVIA = ((((((TOPV3 OR TOPV4) OR TOPV5) OR TOPV6) OR TOPV7) OR
TOPV8) OR TOPV9) OR TOPV10)

COMV9 = (VI9 NOT INTERACT NO_M11_BULK) NOT TOPV9
COMV8 = (VI8 NOT INTERACT NO_M10_BULK) NOT TOPV8
COMV7 = (VI7 NOT INTERACT NO_M9_BULK) NOT TOPV7
COMV6 = (VI6 NOT INTERACT NO_M8_BULK) NOT TOPV6
COMV5 = (VI5 NOT INTERACT NO_M7_BULK) NOT TOPV5
COMV4 = (VI4 NOT INTERACT NO_M6_BULK) NOT TOPV4
COMV3 = (VI3 NOT INTERACT NO_M5_BULK) NOT TOPV3
```
— 530

FIG.5

```
LSM10 = COPY COMM10
LSM9  = COMM9 INTERACT NO_M11_BULK
LSM8  = COMM8 INTERACT NO_M10_BULK
LSM7  = COMM7 INTERACT NO_M9_BULK
LSM6  = COMM6 INTERACT NO_M8_BULK
LSM5  = COMM5 INTERACT NO_M7_BULK
LSM4  = COMM4 INTERACT NO_M6_BULK
LSM3  = COMM3 INTERACT NO_M5_BULK

LSM= (((((((LSM3 OR LSM4) OR LSM5) OR LSM6) OR LSM7) OR LSM8) OR
LSM9) OR LSM10)
```
— 540

```
CONNECT TOPMET PASV_RDL TOPM11 TOPM10 TOPM9 TOPM8 TOPM7
TOPM6 TOPM5 TOPM4

CONNECT TOPM4 COMM4 ME4
CONNECT TOPM5 COMM5 ME5
CONNECT TOPM6 COMM6 ME6
CONNECT TOPM7 COMM7 ME7
CONNECT TOPM8 COMM8 ME8
CONNECT TOPM9 COMM9 ME9
CONNECT TOPM10 COMM10 ME10
CONNECT TOPM11 ME11

CONNECT TOPMET TOPM11 TOPM10 TOPM9 TOPM8 TOPM7 TOPM6 TOPM5
TOPM4

CONNECT LSM3 ME3
CONNECT LSM4 COMM4
CONNECT LSM5 COMM5
CONNECT LSM6 COMM6
CONNECT LSM7 COMM7
CONNECT LSM8 COMM8
CONNECT LSM9 COMM9
CONNECT LSM10 COMM10
CONNECT LSM LSM3 LSM4 LSM5 LSM6 LMS7 LSM8 LSM9 LSM10
CONNECT PASV_RDL TOPMET ME11

CONNECT TOPMET LSM BY TOPVIA

CONNECT COMM10 COMM9 BY COMV9
CONNECT COMM9 COMM8 BY COMV8
CONNECT COMM8 COMM7 BY COMV7
CONNECT COMM7 COMM6 BY COMV6
CONNECT COMM6 COMM5 BY COMV5
CONNECT COMM5 COMM4 BY COMV4
CONNECT COMM4 COMM3 BY COMV3
CONNECT ME3 ME2 BY VI2
CONNECT ME2 ME1 BY VI1
SCONNECT ME1 PO1 NTAP PTAP PSD NSD BY CONT
SCONNECT NTAP NWEL
```
— 550

FIG.5 (cont.)

CORNER[C] S_PSUB INSIDE INNER CORNER-SIZE 125 S_BCOR    731

AND M1    S_BCOR MET1CB
AND M2    S_BCOR MET2CB                                733
AND M3    S_BCOR MET3CB
AND M4    S_BCOR MET4CB  : METAL OPTION MARKER  _MOM_
AND M5    S_BCOR MET5CB  : METAL OPTION MARKER  _MOM_
AND TOPMET S_BCOR MET6CB : METAL OPTION MARKER  _MOM_

SEL MET1CB ANGLE[45] M1E45B
SEL MET2CB ANGLE[45] M2E45B                            735
SEL MET3CB ANGLE[45] M3E45B
SEL MET4CB ANGLE[45] M4E45B ; METAL OPTION MARKER  _MOM_
SEL MET5CB ANGLE[45] M5E45B ; METAL OPTION MARKER  _MOM_
SEL MET6CB ANGLE[45] M6E45B ; METAL OPTION MARKER  _MOM_

NOT MET1CB M1E45B BCMET1B OUTPUT   E6_2BM1 45
NOT MET2CB M2E45B BCMET2B OUTPUT   E6_2BM2 45          737
NOT MET3CB M3E45B BCMET3B OUTPUT   E6_2BM3 45
NOT MET4CB M4E45B BCMET4B OUTPUT   E6_2BM4 45 ; METAL OPTION
MARKER  _MOM_
 NOT MET5CB M5E45B BCMET5B OUTPUT   E6_2BM5 45 ; METAL OPTION
MARKER  _MOM_
 NOT MET6CB M6E45B BCMET6B OUTPUT   E6_2BM6 45 ; METAL OPTION
MARKER  _MOM_

```
ACTIVE_NW = DIFF NOT OUTSIDE NWEL          810
ACTIVE_PS = DIFF OUTSIDE NWEL
NDIF      = ACTIVE_PS  NOT PPLUS
NTAP      = ACTIVE_NW NOT PPLUS
```

RECOMMEND_4.9.ERR {

```
X = BULK INTERACT NPLUS                    820
```

```
( NDIF INTERACT X ) NOT NPLUS              830
( NTAP INTERACT X ) NOT NPLUS
```

COMPUTER RECORDING MEDIUM FOR STORING PROGRAM OF CHECKING DESIGN RULE OF LAYOUT

BACKGROUND OF THE INVENTION

1. Field of Invention

The present invention relates to a method for checking a design rule of layout. More particularly, the present invention relates to a method for inspecting the design rule of layout according to the characteristics of layers in the layout.

2. Description of Related Art

In the design and development of semiconductor chips, the design rule check (DRC) is a program for checking whether the semiconductor integrated circuit follows the topological layout rules (TLR) or not. The topological layout rules have particular rules depending on different process techniques and instrument limitation between wafer factories.

Referring to FIG. 1, it is a conventional flow chart of a method for inspecting whether semiconductor integrated circuits meet the design rules or not, which comprises the following steps.

First, as shown in step 110, a layout comprising a plurality of layers and being in global distribution system (GDS) format is provided. Then, as shown in step 120, the corresponding topological layout rules are determined in manual manner according to different process techniques, conditions of wafer factories, and characters in chips. Next, as shown in step 130, according to the topological layout rules determined in step 120, a corresponding command file is fetched from a prepared command file database 140. In step 150, the layout is inspected and checked by using the design rule check tool according to this command file. Any design error found in the process is shown in the check result 160.

As for the conventional design rule check flow, engineers must design different command files for different process techniques. As current design rule check tools cannot provide information about whether a certain layer exists in the layout or not, it is necessary to manually search the maximum number of layers and select the corresponding command file according to different wafer sizes. No matter whether a suitable program is selected from the design command file database or from the command file database according to the characters in chips so as to perform the design rule check, a large amount of time will be spent which further negatively affects the whole flow of IC design.

SUMMARY OF THE INVENTION

In view of the above, an objective of the present invention is to provide a method for checking the layout design rule, so as to find out characters of a certain layout and perform the design rule check according to the characters.

Another objective of the present invention is to provide a computer readable recording medium, so as to find out the characters of layout to be checked and perform the design rule check according to the characters.

Still another objective of the present invention is to provide a method for checking the layout design rule, so as to check the layers and compare the layers with a flag layer and perform an identified rule according to the size of flag layer.

Based on the above and other objectives, the present invention provides a method for checking the layout design rule, suitable for inspecting whether a layout meets the design rule or not. The method for checking the layout design rule of the present invention includes uniting a layout comprising a plurality of layers, a flag layer obtained by uniting a part of or all the layers in the layout, and checking the layout according to the flag layer.

According to the method for checking the layout design rule in a preferred embodiment of the present invention, if the comparison result of a certain layer with the flag layer is the empty set, it indicates that the layer does not exist in the layout. Otherwise, if the comparison result is the nonempty set, it indicates that the layer exists in the layout. In these existing layers, the layer located at the top place is the top layer in the layout, and other existing layers are referred to as the inner layers. The design rule check respectively uses different rules to check whether the top layer and the inner layers meet the design rule or not.

According to the method for checking the layout design rule in a preferred embodiment of the present invention, the layout is compared with the flag layer to identify the top layer in the layout. First, the graphic $TOPM_N$ is set to be equal to the graphic with maximum layer number in the layout. Then, it is checked that whether or not the flag layer BULK and the graphic $TOPM_N$ have no intersection, if yes, the graphic $NO\_M_N\_BULK$ is set to be the graphic of the flag layer BULK, otherwise the graphic $NO\_M_N\_BULK$ is set to be the empty set. Thereafter, each of the layers in the layout is checked successively from top to bottom. If the layer $ME_i$ and the graphic $NO\_M_{i+1}\_BULK$ of the $i^{th}$ layer in the layout have the intersection, the graphic $TOPM_i$ is set to be the graphic $ME_i$ of the $i^{th}$ layer, otherwise $TOPM_i$ is set to be the empty set, wherein i is an integer greater than 0 and less than N. If the graphic $NO\_M_{i+1}\_BULK$ and the graphic $TOPM_i$ have no intersection, the graphic $NO\_M_i\_BULK$ is set to be equal to $NO\_M_{i+1}\_BULK$, otherwise the $NO\_M_i\_BULK$ is set to be the empty set. Finally, the graphics $TOPM_N \sim TOPM_j$ are united to obtain the graphic of the top layer in the layout, wherein j indicates a minimum value of the number of layers capable of becoming the top layer in the layout.

According to the method for checking the layout design rule of a preferred embodiment of the present invention, it is determined whether to perform a large size identified rule or a small size identified rule to the layout design rule check according to the comparison result of the flag layer with a reference size.

The result obtained from comparing the flag layer with the layout is used as parameters in the command file to perform the proper design rule check.

From another viewpoint, the present invention provides a computer readable recording medium, in which a layout can be checked by performing the programs stored in this medium on the computer system. The programs in the recording medium include reading the instructions of the layout having a plurality of layers, obtaining a flag layer by uniting a part of or all the layers in the layout, and checking whether or not the layout follows the design rule according to the flag layer.

According to the computer readable recording medium in a preferred embodiment of the present invention, the instructions of the program in the above medium include comparing a layer in the layout with the flag layer. If the comparison result is the empty set, it indicates that the layer does not exist. If the comparison result of a layer in the layout with the flag layer is the nonempty set, it indicates that the layer exists in the layout. The top layer in the existing layers is regarded as the top layer in the layout, and other existing layers are regarded as the inner layers. The design rule check uses different check rule according to whether or not the layer is the top layer.

According to the computer readable recording medium in a preferred embodiment of the present invention, the layout is compared with the flag layer to determine that the first instruction of the uppermost layer in the layout sets the graphic $TOPM_N$ to be equal to the graphic with the maximum possible number of layers in the layout. The second instruction checks whether or not the flag layer BULK and the graphic $TOPM_N$ have no intersection. If yes, the graphic $NO\_M_N\_BULK$ is set to be the graphic of the flag layer BULK, otherwise the graphic $NO\_M_N\_BULK$ is set to be the empty set. The third instruction checks each of the layers in the layout successively from top to bottom. If the $i^{th}$ layer $ME_i$ in the layout and the graphic $NO\_M_{i+1}\_BULK$ have the intersection, the graphic $TOPM_i$ is set to be the graphic of the $i^{th}$ layer $ME_i$, otherwise the $TOPM_i$ is set to be the empty set, wherein i is an integer greater than 0 and less than N. If the graphic $NO\_M_{i+1}\_BULK$ and the graphic $TOPM_i$ have no intersection, the graphic $NO\_M_i\_BULK$ is set to be equal to the $NO\_M_{i+1}\_BULK$, otherwise the $NO\_M_i\_BULK$ is set to be the empty set. The last instruction unites the graphics $TOPM_N\sim TOPM_j$ to obtain the graphic of the top layer in the layout, wherein j indicates a minimum value of the number of the layers capable of becoming the top layer in the layout.

According to the computer readable recording medium in a preferred embodiment of the present invention, the program instructions in the above medium also include comparing the graphic of the flag layer with a reference size. If the flag layer is larger than the reference size, a large size identified rule is used. Otherwise, if the flag layer is smaller than the reference size, a small size identified rule is used to check whether or not the layout meets the design rule.

The program in the readable recording medium acquires the desired parameters by comparing the layout and the flag layer, and uses the parameters in the command file to perform the design rule check.

From another viewpoint, the present invention provides a method for checking the layout design rule used to inspect whether or not a layout meets the design rule check. The method for checking the layout design rule of the present invention includes a layout having a plurality of layers, a flag layer obtained by uniting a part of or all the layers in the layout, comparing the layers with the flag layer and checking the layers, and comparing the graphic size of the flag layer with a reference size to perform the identified rule.

According to the method for checking the layout design rule in a preferred embodiment of the present invention, the step for comparing the layers with the flag layer and checking the layers includes comparing the layers in the layout respectively with the flag layer. If the comparison result is the empty set, it indicates that the layer does not exist in the layout. In all the layers existing in the layout, the uppermost one is referred to as the top layer in the layout, and the other layers are referred to as the inner layers. The top layer rule check is used in the design rule check of the top layer, and the internal rule check is used to check the inner layers in the layout.

The present invention employs a method for checking the layout design rule, in which the characters in the layout are obtained according to the flag layer generated by the layout, and generates proper parameters according to the characters of the content such that the parameters can be used in a general command file to perform the design check. According to this method, it is not required to manually select the command file for the design rule check in accordance with different process techniques or chip characters, etc, so as to inspect the design rule check.

In order to make the aforementioned and other objectives, features and advantages of the present invention comprehensible, preferred embodiments accompanied with figures are described in detail below.

BRIEF DESCRIPTION OF THE DRAWINGS

FIGS. 5, 7, and 8 show an embodiment of the program of the design check rule.

DESCRIPTION OF EMBODIMENTS

The First Embodiment

Figure 1:
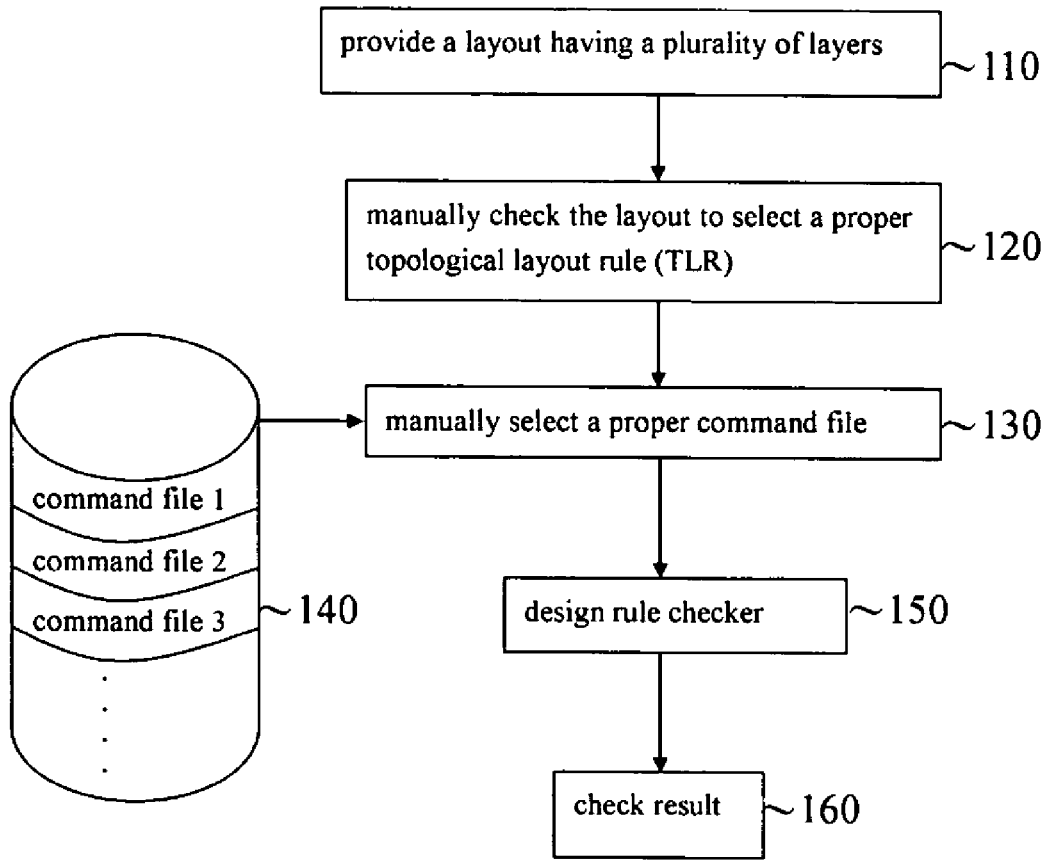
FIG. 1 shows a flow chart of the conventional layout design rule check.
Figure 2:
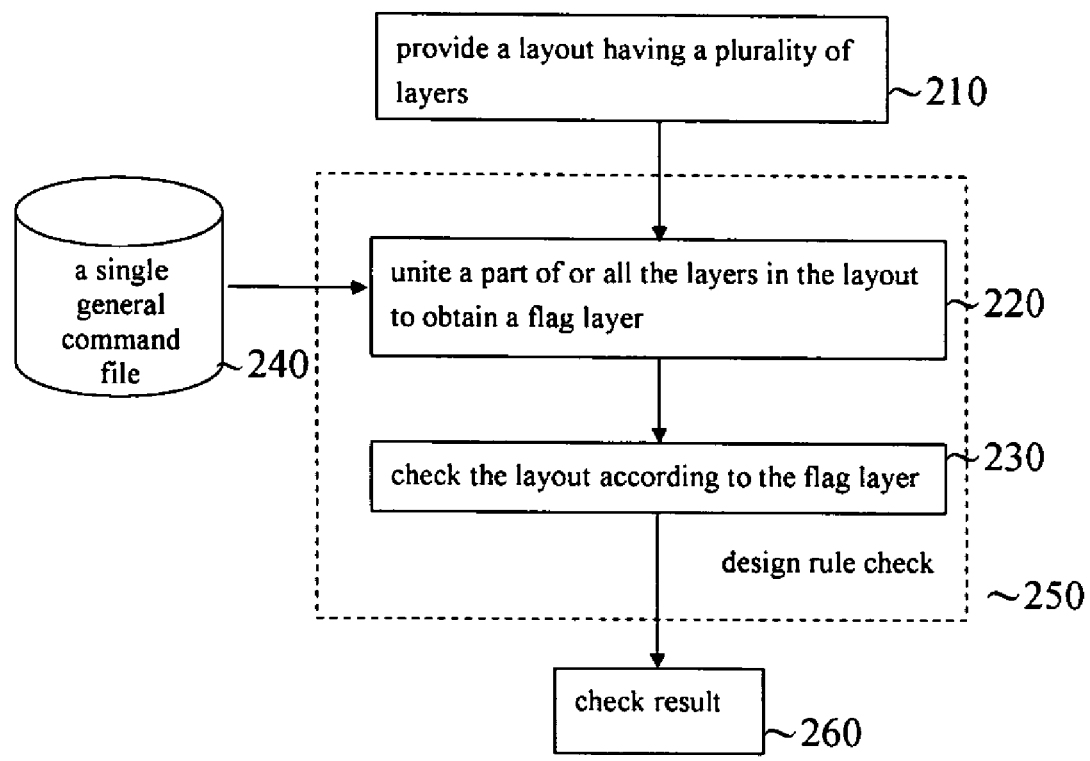
FIGS. 2 and 10 show flow charts of the method for checking the layout design rule.

FIG. 2 is a flow chart of the method for checking the layout design rule according to a preferred embodiment of the present invention. As shown in FIG. 2, this method mainly uses a method for checking the layout design rule and a common command file 240 to perform a design rule check 250 in the format of such as global distribution system (GDS) and generate a result 260 of the rule check.

First, as shown in step 210, a layout is provided, wherein the layout comprises a plurality of layers. In this embodiment, the layout is a GDS format file.

Second, as shown in step 220, a part of or all the layers in the layout are united to obtain a flag layer. In this embodiment, all the layers in the layout are combined to obtain a flag layer called BULK.

Third, as shown in step 230, the layout is checked according to the flag layer BULK.

Figure 3:
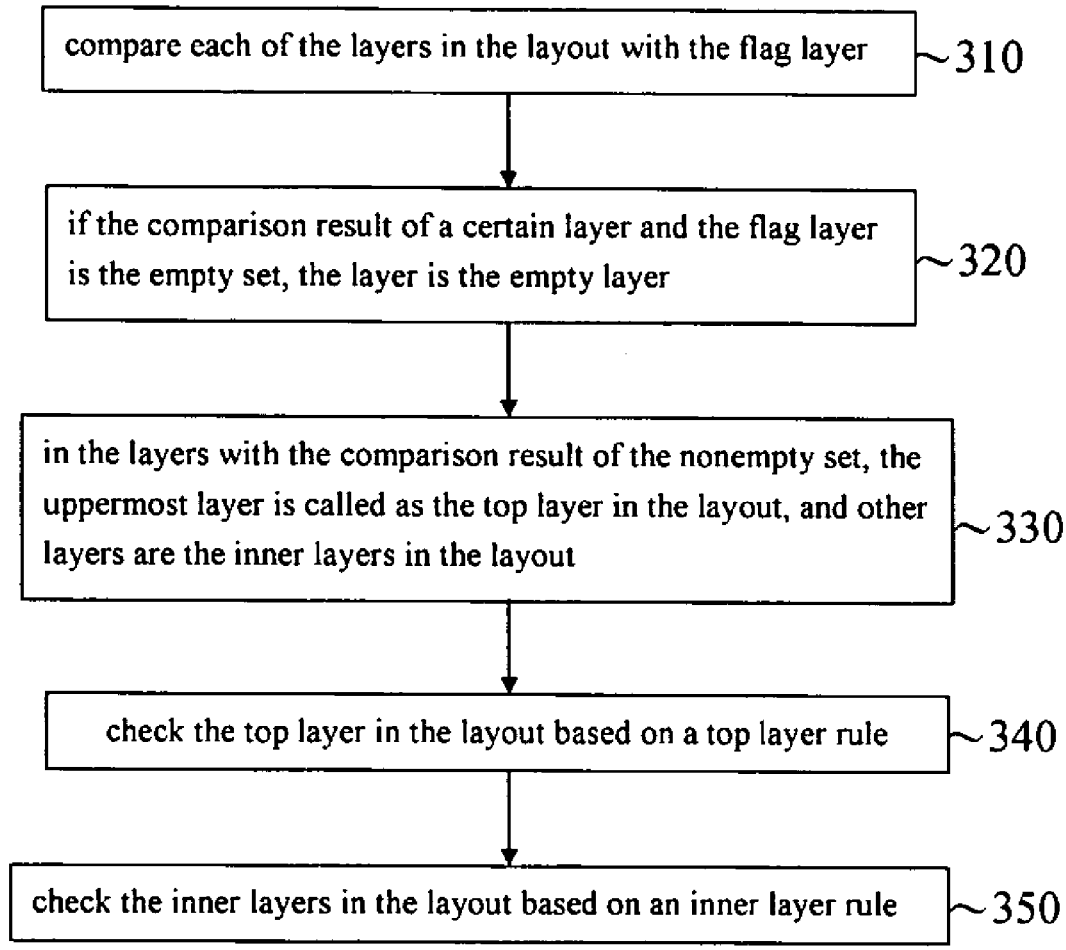
FIG. 3 shows a flow chart of the method for checking the layout according to the flag layer in the method for checking the layout design rule.

According to the demands of users, various check items can be performed in step 230. The user can write the command of the items to be checked in a general command file beforehand. As shown in FIG. 3, it is a flow chart illustrating the substeps in the step 230 according to an embodiment of the present invention. Referring to FIG. 3, as shown in step 310, the layers in the layout are respectively compared with the flag layer. If the comparison result of a certain layer in the layers with the flag layer is the empty set, it indicates that the layer is an empty layer (step 320). If the comparison result of a certain layer in the layers with the flag layer is not the empty set, in the layers with the comparison result of nonempty set, the uppermost layer is referred to as the top layer in the layout, and the other existing layers which are not the top layer are the inner layers in the layout (step 330). According to the comparison result, an top layer rule is used to check the uppermost layer in the layout (step 340), and an inner layer rule is used to check the inner layers in the layout (step 350).

Figure 4:
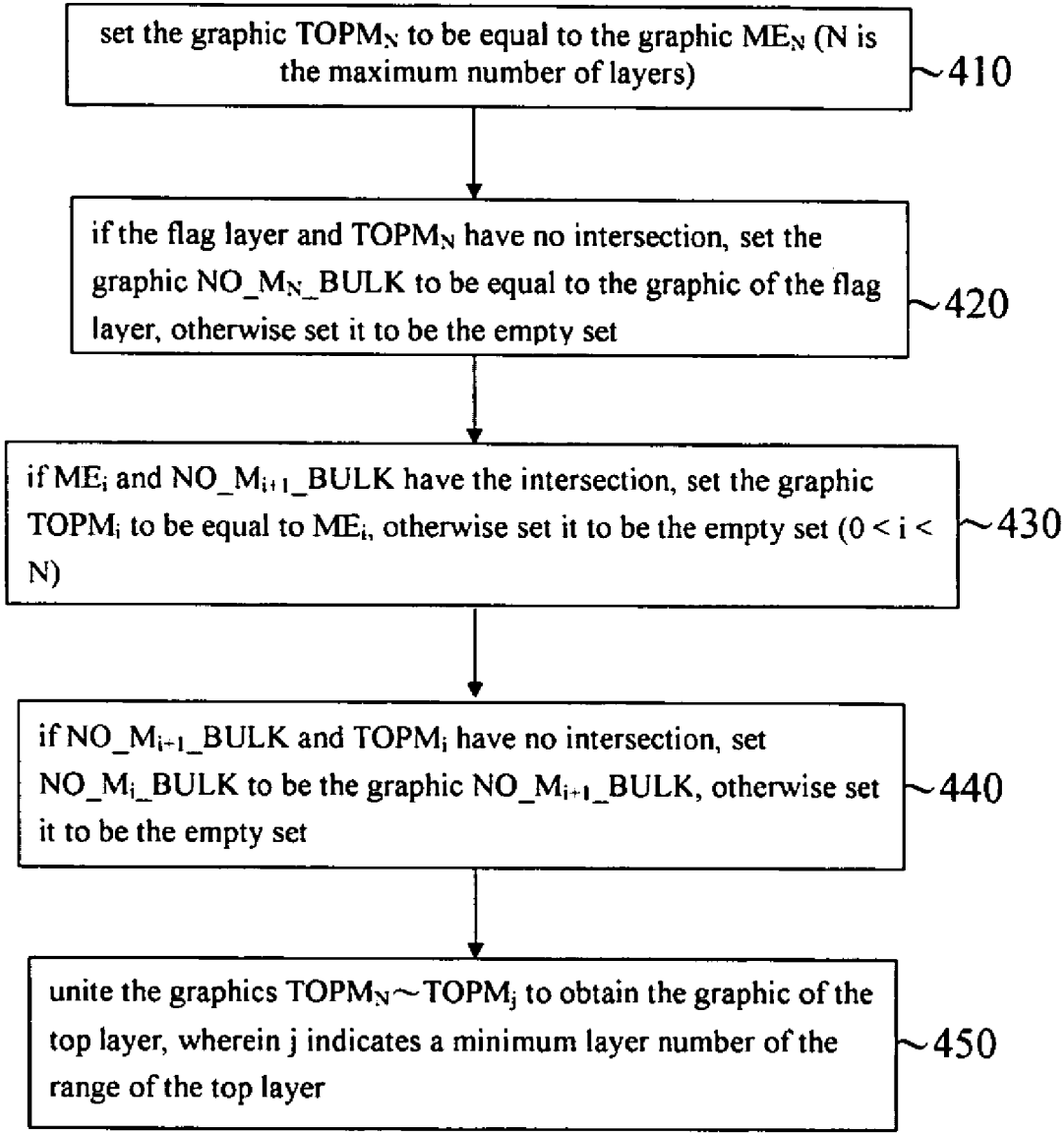
FIG. 4 shows a flow chart of the method for comparing the layout with the flag layer to obtain the top layer.

Referring to FIGS. 3 and 4, in the step 330 of FIG. 3, the details of the method for identifying the uppermost layer in the layout are described as follows. First, the graphic $TOPM_N$ is set to be equal to the graphic $ME_N$ of the $N^{th}$ layer in the layout, wherein N is the maximum number of layers in the layout (step 410). In step 420, check whether or not the flag layer BULK and the graphic $TOPM_N$ have no intersection. If yes, the graphic $NO\_M_N\_BULK$ is set to be equal to the graphic of the flag layer BULK, otherwise the graphic $NO\_M_N\_BULK$ is set to be the empty set. In step 430, if the $i^{th}$ layer $ME_i$ in the layout and the graphic $NO\_M_{i+1}\_BULK$ have the intersection, the graphic $TOPM_i$ is set to be equal to the graphic $ME_i$ of the $i^{th}$ layer in the layout, otherwise the graphic $TOPM_i$ is set to be the empty set, wherein the i is an integer greater than 0 and less than N. In step 440, check whether or not the graphic $NO\_M_{i+1}\_BULK$ and the graphic $TOPM_i$ have no intersection, the graphic $NO\_M_i\_BULK$ is set to be equal to the graphic $NO\_M_{i+1}\_BULK$, otherwise the graphic $NO\_M_i\_BULK$ is set to be the empty set. The graphic $TOPM_i$ generated in the above steps is equal to the graphic of the $i^{th}$ layer only when the value of i is not the number of the top layer in the layout, otherwise it is set to be the empty set. In step 450, the graphics $TOPM_N \sim TOPM_j$ are united to obtain the graphic of the top layer in the layout, wherein j indicates a minimum value of the possible range of the top layer in the layout.

In the method for checking the layout design rule, by comparing the flag layer and the layout, the graphic of the layers except the top layer in the layout can be found. First, check whether or not the graphic $ME_i$ of the $i^{th}$ layer in the layout and $NO\_M_{i+1}\_BULK$ have the intersection. If no, the graphic $COMM_i$ is set to be equal to the graphic $ME_i$. If yes, the $COMM_i$ is set to be the empty set. The graphic of $COMM_i$ not being equal to the empty set indicates that the graphic is the graphic of $i^{th}$ layer which is not the top layer in the layout, wherein i is an integer greater than 0 and less than N.

If N is the maximum possible number of layers in the layout, the graphic $LSM_{N-1}$ is set to be equal to the graphic of the $N-1^{th}$ layer in the layout. This method for checking the layout design includes checking the $N-1^{th}$ to the first layer successively from top to bottom. If the graphic $COMM_k$ (K is an integer greater than 0 and less than N-1) and the graphic $NO\_M_{k+2}\_BULK$ have the intersection, the $LSM_k$ is set to be equal to $COMM_k$, otherwise the $LSM_k$ is set to be the empty set. Only the graphic $LSM_k$ of the layer k just below the top layer in the layout is not the empty set, and thus the $LSM_{N-1} \sim LSM_1$ can be united to obtain the graphic of the layer just below the top layer in the layout.

Here, a layout having a maximum possible number of layers of 11 is taken as an example. FIG. 5 shows an example of the command file used for the design rule check of the Calibre program of Mentor Company in an embodiment of the present invention. It should be noted that for the purpose of convenience of illustration FIG. 5 only a part of the content of the general command file is shown. According to the above step 220 of FIG. 2, the flag layer BULK is the union of metal layers 1 to 11 in the layout. Referring to the command code block 510 in FIG. 5, if it is desired to obtain the graphic information of the top layer from the GDS format layout, first the graphic $TOPM_{11}$ is set to be the graphic of the $11^{th}$ metal layer $ME_{11}$. Next, as shown in step 420~step 440 in FIG. 4, the content of $TOPM_i$ and $NO\_M_i\_BULK$ is set, wherein i is an integer greater than 0 and less than 11. In this embodiment, the top layer in the layout is assumed to be the $10^{th}$ metal layer, and the $1^{st}$ metal layer to the $3^{rd}$ metal layer definitely exist in the process, and thus the minimum value j of the possible range of the top layer in the layout (GDS file) is 4.

Referring to FIGS. 4 and 5 at the same time, according to step 410~step 450, after the instruction "TOPM11=COPY ME11" is executed, the graphic $TOPM_{11}$ is set to be the graphic of the $11^{th}$ metal layer that does not exist, which is the empty set in this embodiment. As the flag layer BULK and the graphic $TOPM_{11}$ of the $11^{th}$ layer (the empty set herein) have no intersection, after the instruction "NO_M11_BULK=BULK NOT INTERACT TOPM11" is executed, a flag layer $NO\_M_{11}\_BULK$ without the $11^{th}$ metal layer is set to be BULK. Since the uppermost metal layer in the layout is assumed to be the $10^{th}$ metal layer in this embodiment, i.e., the $10^{th}$ metal layer and the graphic $NO\_M_{11}\_BULK$ set as BULK definitely have the intersection, after the instruction "TOPM10=ME10 INTERACT NO_M11_BULK" is executed, $TOPM_{10}$ is set to be the graphic $ME_{10}$. Additionally, as the $NO\_M_{11}\_BULK$ and $TOPM_{10}$ have the intersection, after the instruction "NO_M10_BULK=NO_M11_BULK NOT INTERACT TOPM10" is executed, the $NO\_M_{10}\_BULK$ is set to be the empty set. After the instruction "TOPM9=ME9 INTERACT NO_M10_BULK" is executed, the graphic $ME_9$ of the ninth metal layer and $NO\_M_{10}\_BULK$ which is the empty set in this embodiment have no intersection, the $TOPM_9$ is set to be the empty set. In this way, the value of $TOPM_8 \sim TOPM_4$ can be obtained. In the method of comparing the flag layer and the layout to obtain the top layer, only the graphic of $TOPM_{10}$ corresponding to the top layer 10 is designated to be $ME_{10}$ in this embodiment. Graphics $TOPM_4 \sim TOPM_9$ and $TOPM_{11}$ are all set to be the empty set. By uniting the graphics $TOPM_4$ to $TOPM_{11}$, the graphic of the top layer in this layout can be obtained.

Then, referring to the command code block 520 of FIG. 5, after the instruction "COMM10=(ME10 NOT INTERACT NO_M11_BULK) NOT TOPM10" is executed, the graphic of the $10^{th}$ metal layer in the layout and the graphic $NO\_M_{11}\_BULK$ have the intersection, thus the graphic $COMM_{10}$ is the empty set. Since the $9^{th}$ metal layer and the graphic $NO\_M_{10}\_BULK$ that is the empty set have no intersection, after the instruction "COMM9=(ME9 NOT INTERACT NO_M10_BULK) NOT TOPM9" is executed, the graphic $COMM_9$ is set to be the graphic of the $9^{th}$ metal layer $ME_9$. In this way, whether or not the other layers are the inner layers in the layout can be deduced by the command code block 520.

Referring to the command code block 540 of FIG. 5, the instruction "LSM10=COPY COMM10" sets $LSM_{10}$ to be graphic $COMM_{10}$, which is the empty set in this embodiment. As the graphic $COMM_9$ (the graphic of $ME_9$ herein) and $NO\_M_{11}\_BULK$ have the intersection, after the instruction "LSM9=COMM9 INTERACT NO_M11_BULK" is executed, the graphic $LSM_9$ is the graphic of $COMM_9$. As the graphic $COMM_8$ (the graphic of $ME_8$ herein) and the graphic $NO\_M_{10}\_BULK$ (which is the empty set here) have no intersection, after the instruction "LSM8=COMM8 INTERACT NO_M10_BULK" is executed, the value of the graphic $LSM_8$ is set to be the empty set. In this way, except that the graphic $LSM_i$ corresponding to the metal layer just below the top layer (the top layer is assumed to be the $10^{th}$ metal layer $ME_{10}$ in this embodiment) of the layout is equal to the graphic $COMM_i$, the $LSM_k$ of the other layers is the empty set. Thus, in this embodiment, $LSM_{10} \sim LSM_3$ can be united to obtain the graphic of the layer just below the top layer in this layout (it is assumed to be the $9^{th}$ metal layer $ME_9$ in this embodiment).

In FIG. 5, the command code block 520 and the command code block 530 can automatically analyze the information of the top via of the top layer and the internal top via in the layout according to the similar logic. The command code block 550 substitutes all the variable values previously obtained into the parameter positions required by the command file instruction to perform the layout design rule check.

According to the conventional art, first the GDS format layout file must be opened, and which layer in the layout is the uppermost metal layer is checked manually. Taking the process of 1P5M as an example, the user must manually check to confirm that the uppermost metal layer in the layout is disposed at the $5^{th}$ metal layer, and then select a command file suitable for the 1P5M process from a plurality of command files, so as to perform the "design rule check" to the layout. Compared with the conventional art, a single command file is required in the embodiment of the present invention. As the uppermost metal layer in the layout can be automatically identified from the command file, the present invention can automatically perform the design rule check without requiring manpower.

The Second Embodiment

Figure 6:
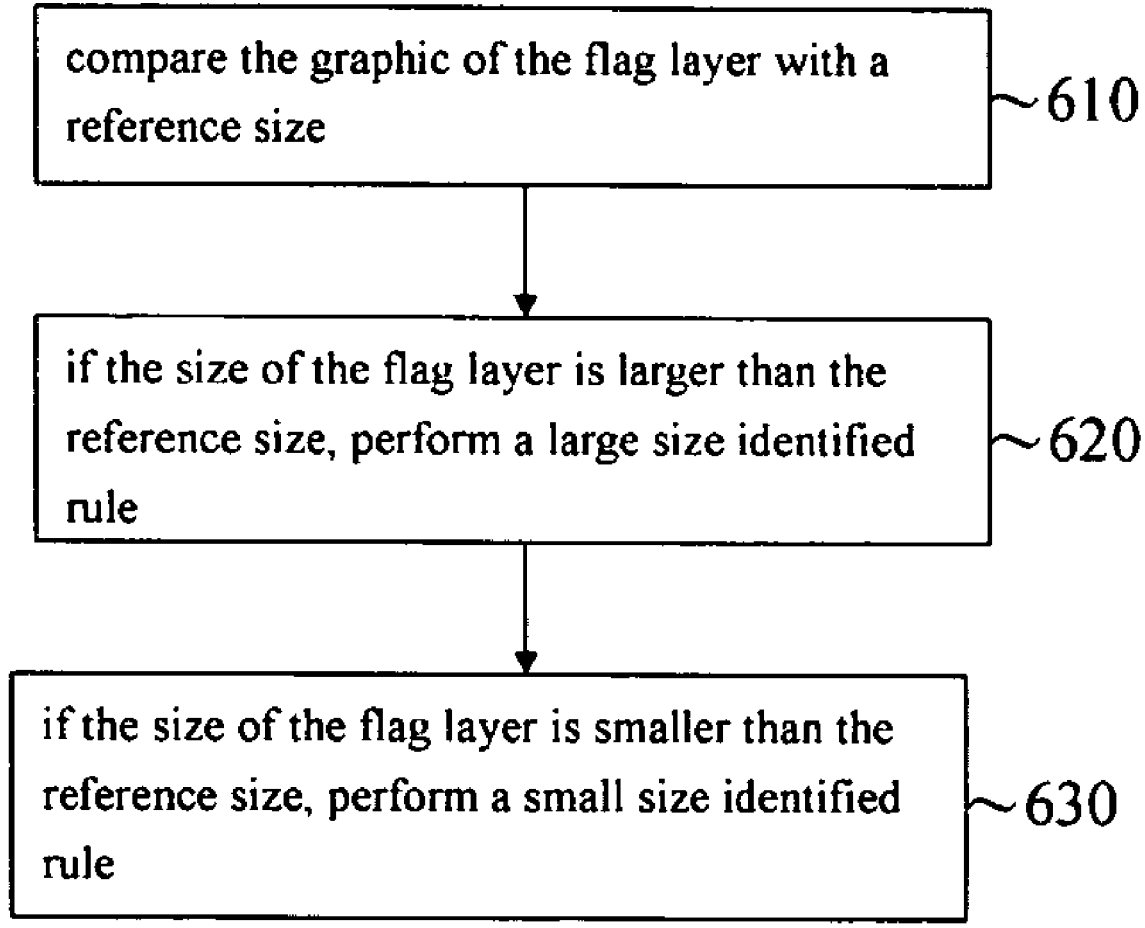
FIG. 6 shows a flow chart of the method for determining the size identified rule.

The user may carry out other check items in step 230 as required, and write the command of the item to be checked into the common command file beforehand. FIG. 6 shows a flow chart illustrating the substeps in step 230 according to the embodiment of the present invention. Referring to FIGS. 2 and 6 together, in step 220, a part of or all the layers in the layout are united to obtain a flag layer. In this embodiment, all the layers in the layout can be united to obtain a flag layer called PSUB. In the step 230 of FIG. 2, the information required by the die corner rule can be generated by checking the layout according to the flag layer. In step 610 of FIG. 6, the flag layer obtained by uniting all the layers in the layout is compared with a reference size. As shown in step 620, when the size of the flag layer is larger than the reference size, a large size identified rule is performed. Otherwise, if the size of the flag layer is smaller than the reference size, a small size identified rule is performed (as shown in step 630). The method for performing the identified rule involves first setting the graphic B_BCOR to be equal to the corner graphic of the flag layer, intersecting the graphic $M_h$ of the $h^{th}$ metal layer in the layout and the graphic B_BCOR, and setting the intersection result to be the graphic $MET_hCA$, wherein h is an integer greater 0 and less than N+1, and N is the maximum number of layers in the layout. Finally, it is checked whether or not a part of the graphics is not arranged at an angle of 45° in the graphic $MET_hCA$.

Figure 7:
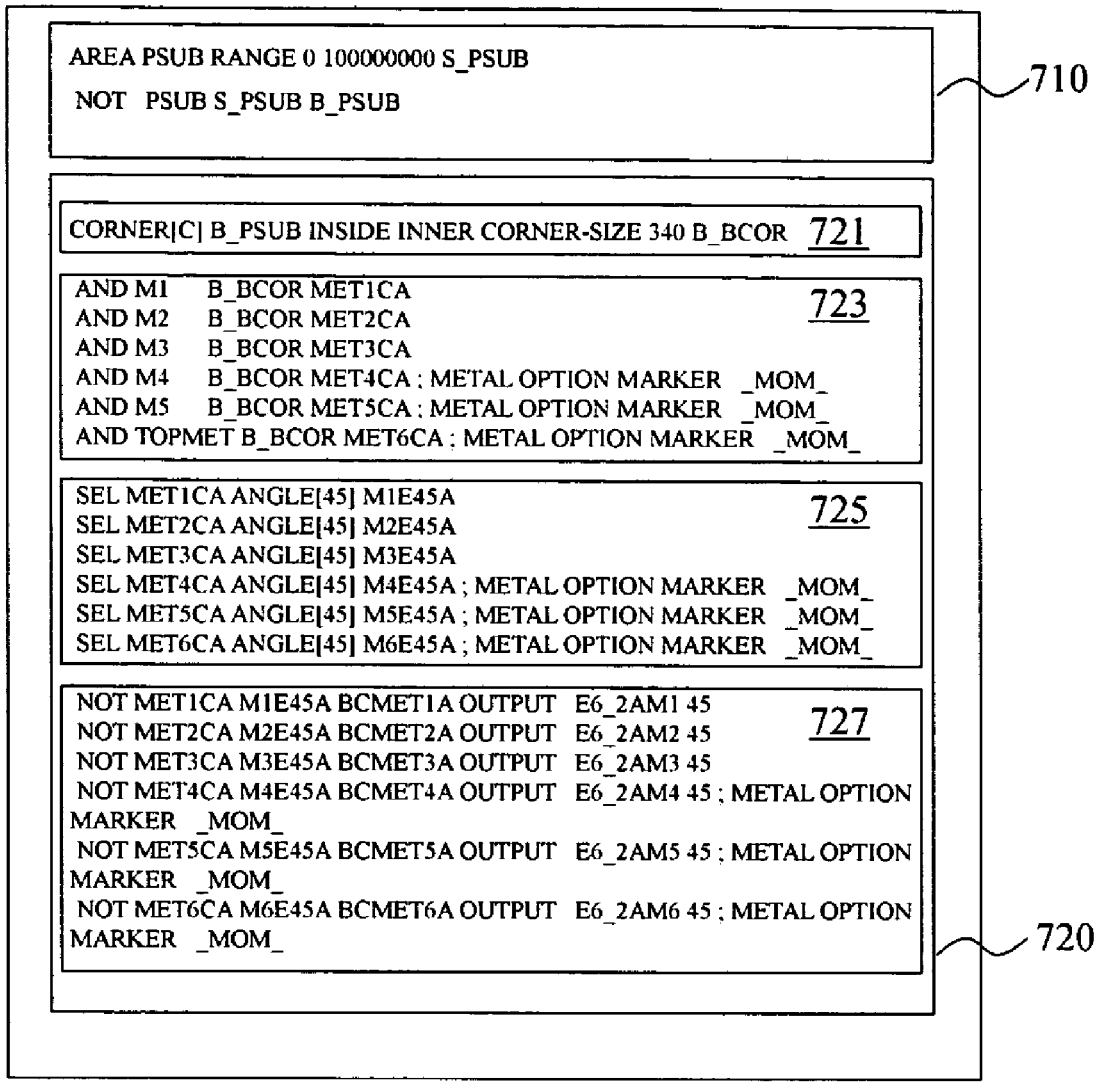

Taking a layout with the maximum number of layers of 6 as an example, FIG. 7 is an example of a command file of the design rule check used in DRACULA program of Cadence Company in the embodiment of the present invention. As shown in the command code block 710, first the values of S_PSUB and B_PSUB are set according to the size of the flag layer PSUB. In this embodiment, the flag layer PSUB is the union of the graphics of layers 1 to 6. If the size of the flag layer PSUB is between 0 and 100 mm$^2$, the graphic S_PSUB is set to be PSUB, and the graphic B_PSUB is the empty set. Otherwise, if the size of the flag layer is larger than 100 mm$^2$, the graphic B_PSUB is set to be the graphic of the flag layer PSUB and the graphic S_PSUB is the empty set. The command code block 720 is the part of the program executed by the design rule check when the flag layer PSUB meets the large size identified rule, i.e. when the size of the flag layer PSUB is larger than 100 mm$^2$. The command code 721 designates the range of the corner graphic B_BCOR according to the graphic B_PSUB. In this embodiment, B_BCOR is a graphic constituted of four squares with the side length of 340 um respectively counted from the internal angles of 4 dies. The command code block 723 respectively sets the graphic $MET_1CA$ to the graphic $MET_6CA$ to be the graphics in layers 1 to 6 that has the intersection with the B_BCOR. The command code block 725 finds out the graphics arranged at an angle of 45° in the graphics $MET_1CA$ to $MET_6CA$. The command code block 727 finds out the graphics not arranged at an angle of 45° in the graphics $MET_1CA$ to $MET_6CA$, which are considered to be errors and then output.

The command code block 730 checks errors through the similar flows according to the small size identified rule. The command code 731 sets the range of the corner graphic S_BCOR used in the small size identified rule check. In this embodiment, the graphic S_BCOR is a graphic constituted of four squares with the side length of 125 um respectively counted from the corners of 4 dies. The command code blocks 733, 735, and 737 check out the graphics intersected with the corner graphics and not arranged at an angle of 45° in the layers 1 to 6, which are considered to be errors and then output.

In the conventional art, first the GDS format layout file must be opened, and then the size of the layout is manually measured to determine which identified rule the layout is suitable for. And the content of the command file is modified according to the manually checked result, making the content meets the corresponding size identified rule. Compared with the conventional art, after the embodiment of the present invention executes the command code block 710, the size of the layout can be automatically determined. If the size of the flag layer is between 0 and 100 mm$^2$, as the graphic B_PSUB is the empty set, the check result is not affected after the large size identified rule described in the command code block 720 is executed. Otherwise, if the size of the flag layer is larger than 100 mm$^2$, as the graphic S_PSUB is the empty set, the check result is also not affected after the small size identified rule described in the command code block 730 is executed and the rule design check is performed. Differing from the conventional art, in the present invention, it is not required to manually check the size of the layout. Only a single command file is used to check the layout no matter whether it is checked based on the large size identified rule or the small size identified rule.

The Third Embodiment

The user can carry out other check items in the step 230 of FIG. 2 as required, for example, check whether or not a specific layer exists in the layout, and write the command of the item to be checked in the common command file 240 beforehand. The flag layer generated by uniting all the layers in the layout can be used to check whether or not a specific layer exists in the layout. Here, checking whether or not the layer NPLUS exists in a GDS format layout is taken as an example to illustrate another possible embodiment of the present invention. FIG. 8 is an example of a command file of the design rule check used for the Calibre program of Mentor Company according to an embodiment of the present invention.

Referring to FIG. 8, in order to clearly illustrate the point of this embodiment, FIG. 8 only shows a part of the content in the common command file. The command code block 810 defines ACTIVE_NW and ACTIVE_PS according to the relationship of the diffusion DIFF graphic and the N-type well NWEL graphic, and then defines NDIF and NTAP respectively according to the relationship of the graphic ACTIVE_NW, ACTIVE_PS and the layer NPLUS. As shown in the command code block 820, if the layer NPLUS and a flag layer BULK obtained by uniting all the layers in the layout have the intersection, it indicates that the layer NPLUS exists in this layout, thus setting the graphic X to be the graphic of the flag layer BULK. Otherwise, if the layer NPLUS and the flag layer BULK have no intersection, it indicates that the layer NPLUS does not exist, thus setting the graphic X to be the empty set.

The command code block 830 is used to output the check result. If the graphic NDIF and the graphic X have the intersection, the graphic of the layer NPLUS is deducted from the graphic NDIF and then output. If the graphic NTAP and the graphic X have the intersection, the graphic of the layer NPLUS is deducted from the graphic NTAP and then output. Therefore, the design rule check is performed to the two graphics NDIF and NTAP defined in the command code block 810 beforehand by using the result to check whether or not the layer NPLUS exists in the layout (in this embodiment, the check result is stored in a region variable X).

In the conventional art, if it is required to check whether or not a specific layer exists in the layout, first the GDS format layout file must be opened, and then the layout file must be checked manually. However, compared with the conventional art, the present invention uses a flag layer generated by uniting all the layers in the layout to accurately determine whether or not a specific layer exists in the layout, and further automatically output the check result.

The Fourth Embodiment

Figure 9:
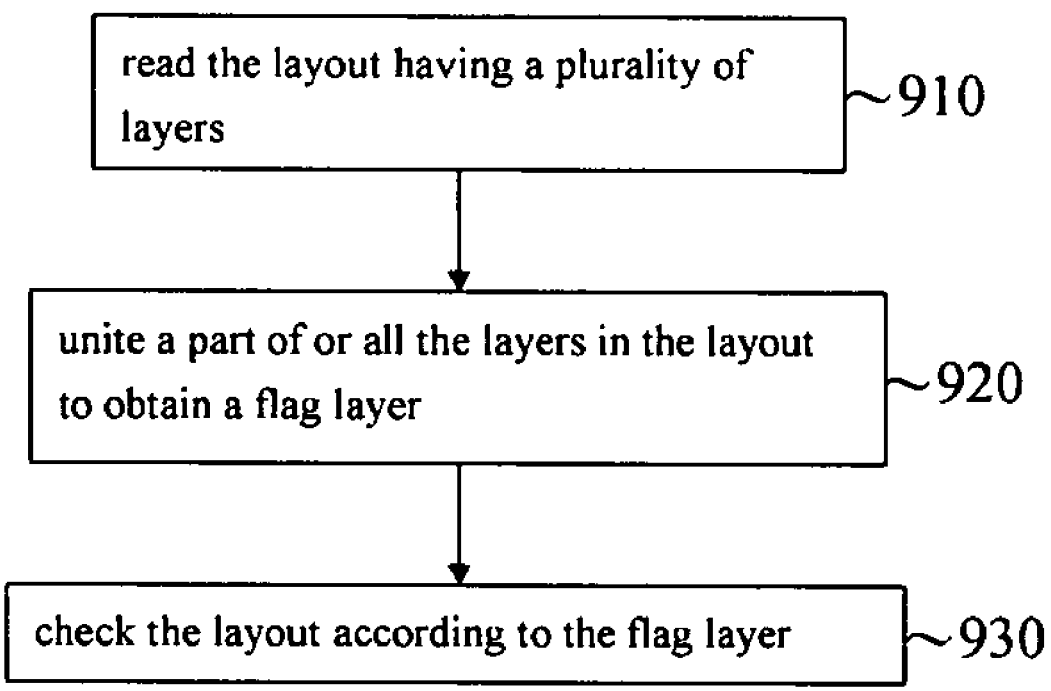
FIG. 9 shows a flow chart of the program stored in a computer readable recording medium and being provided with a function of checking whether or not a layout follows the design rule.

FIG. 9 is a flow chart of a program capable of performing the layout design rule check according to the preferred embodiment of the present invention. This program can be stored in a computer readable recording medium such as a hard disk, an optical disk, or a magnetic disk. Referring to FIG. 9, this program can be used to check whether or not the GDS format layout in this embodiment meets the design rule.

As shown in step 910, this program reads the layout having a plurality of layers. In step 920, the program unites a plurality of layers or all the layers in the layout to obtain a flag layer. In step 930, whether or not the layout follows the design rule is checked according to the flag layer. The above step 920 and step 930 can be implemented referring to the above embodiments, and the details will not be repeated herein.

In the conventional art, the GDS format layout file must be opened, and through a manual check the information of layout is obtained, and the suitable command file is found according to the information to perform the design rule check. Different from the conventional art, the embodiment of the present invention can provide the information about the top layer, the inner layers, the layer just below the top layer, etc. of the layout by comparing the flag layer and the layout. The flag layer can be used to determine whether or not the layout is suitable for the large size or the small size identified rule. The information is used in a single command file to automatically perform the design rule check.

The Fifth Embodiment

Figure 10:
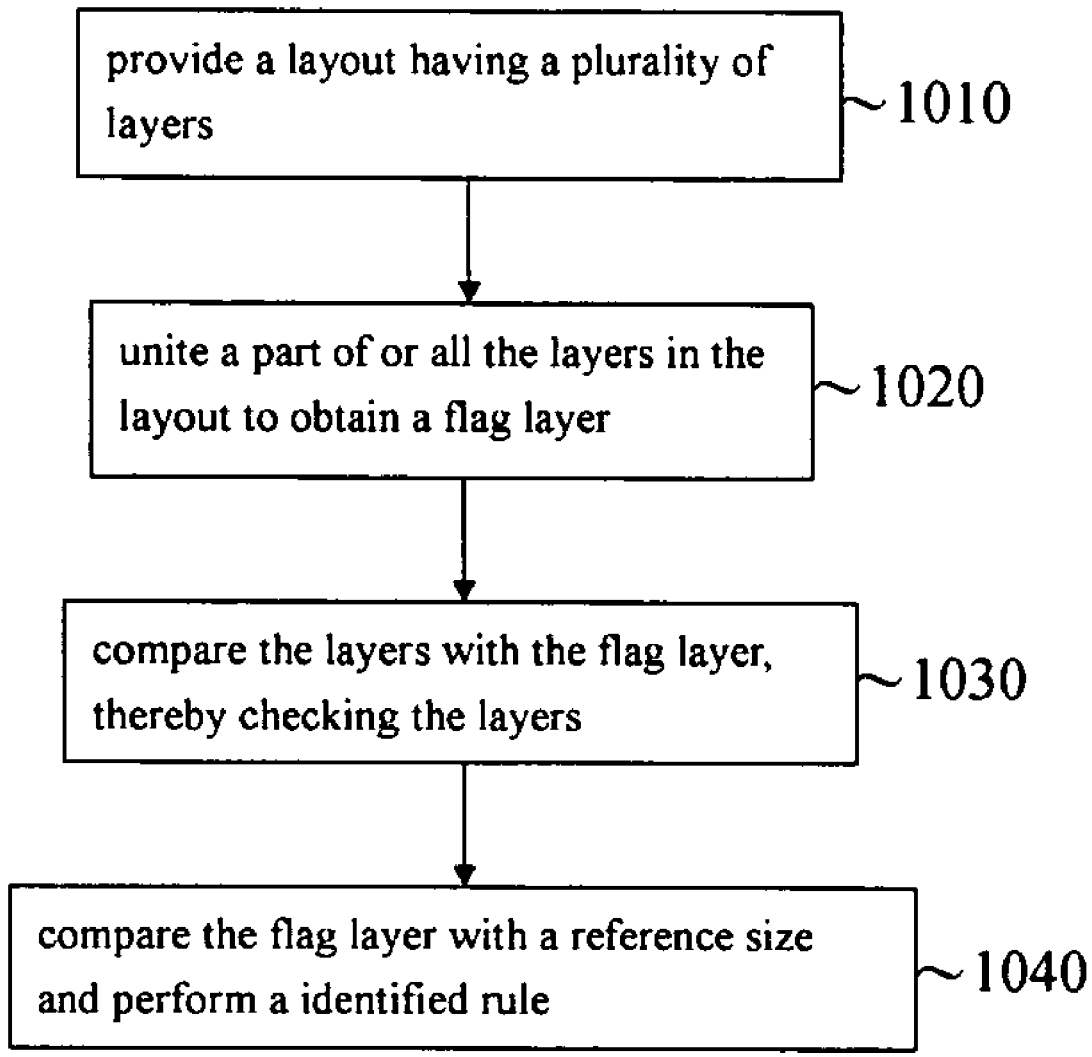

Referring to FIG. 10, it is a flow chart of a method for checking the layout design rule of a layout according to the preferred embodiment of the present invention.

The steps of the check method are described as follows. In step 1010, a layout having a plurality of layers is provided. In step 1020, a part of or all the layers are united to obtain a flag layer according to the layout. In step 1030, the flag layer is compared with each of the layers in the layout, thereby checking the layers. In step 1040, the graphic of the flag layer is compared with a reference size, thereby performing the corresponding identified rule. The above steps 1020, 1030, and 1040 can be implemented with reference to the above embodiments, and the details will not be repeated herein again.

Different from the conventional art, the layout is manually checked and then the command file suitable for the layout is found to perform the rule check. The embodiment of the present invention may attain the parameters of the command file required for the design check by comparing the layers with the flag layer, such as the graphic of the top layer, the graphic of the layer just below the top layer, the graphic of the inner layer, or the range of the size of the layout, so as to automatically perform the design rule check.

In view of the above, in the method for checking the layout design rule and the computer readable recording medium of the present invention, the parameters required for a single command file are generated by comparing the flag layer and the layout. The corresponding design rule check is automatically performed according to the parameters. The automation can save a large amount of time and also reduce the errors resulting from the manual judgment, so as to improve the production efficiency in the semiconductor industry.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A computer readable recording medium storing thereon a program, which causes a computer system to perform a method for checking a layout, the method comprising:
   reading the layout, wherein the layout comprises a plurality of layers;
   uniting a part of or all the layers in the layout to obtain a flag layer;
   checking the layout according to the flag layer; and
   generating a result of the checking, for inspecting whether the layout meets design rule or not.

2. The computer readable recording medium as claimed in claim 1, wherein the layout is a GDS (global distribution system) format file.

3. The computer readable recording medium as claimed in claim 1, wherein the flag layer is a union of all the layers in the layout.

4. The computer readable recording medium as claimed in claim 1, wherein the step for checking the layout according to the flag layer comprises:
   comparing each of the layers in the layout with the flag layer:
   if a certain layer in the layers with the flag layer is empty set, indicating that said certain layer is an empty layer; and
   if the result of the comparing for a certain layer in the layers with the flag layer is nonempty set, in the layers with the result of the comparing being nonempty set, the uppermost layer is the top layer in the layout, and other layers below the top layer are the inner layers in the layout;
   checking the top layer in the layout based on a top layer rule; and
   checking the inner layers in the layout based on an inner layer rule.

5. The computer readable recording medium as claimed in claim 4, wherein the step for comparing each of the layers in the layout with the flag layer comprises:
   setting graphic ($TOPM_N$) corresponding to an $N^{th}$ top layer to be equal to graphic of the $N^{th\ layer\ (ME}_N)$ in the layout, wherein N is a maximum number of layers in the layout;
   if the flag layer (BULK) and the graphic ($TOPM_N$) have no intersection, setting graphic ($NO\_M_N\_BULK$) to be equal to graphic of the flag layer (BULK), otherwise setting the graphic ($NO\_M_N\_BULK$) to be empty set, wherein the graphic ($NO\_M_N\_BULK$) indicates the graphic of the flag layer without the $N^{th}$ layer;
   if graphic of the $i^{th}$ layer ($ME_i$) in the layout and graphic ($NO\_M_{i+1}\_BULK$) have an intersection, setting graphic (TOPM$_i$) to be equal to the graphic of the i$^{th}$ layer (ME$_i$) in the layout, otherwise setting the graphic (TOPM$_i$) to be empty set, wherein i is an integer greater than 0 and less than N;

if the graphic (NO_M$_{i+1}$_BULK) and the graphic (TOPM$_i$) have no intersection, setting graphic (NO_M$_i$_BULK) to be equal to the graphic (NO_M$_{i+1}$_BULK), otherwise setting the graphic (NO_M$_i$_BULK) to be empty set; and uniting the graphics (TOPM$_N$~TOPM$_j$) to obtain the top layer in the layout, wherein j indicates a minimum value of a possible range of the top layer in the layout.

6. The computer readable recording medium as claimed in claim 5, wherein the step for comparing each of the layers in the layout with the flag layer further comprises:

if graphic of the i$^{th}$ layer (ME$_i$) in the layout and the graphic (NO_M$_{i+1}$_BULK) have no intersection, setting graphic (COMM$_i$) to be equal to the graphic of the i$^{th}$ layer (ME$_i$), otherwise setting the graphic (COMM$_i$) to be empty set;

wherein the graphic (COMM$_i$) indicates the graphic of one of layers except the top layer in the layout.

7. The computer readable recording medium as claimed in claim 6, wherein the step for comparing each of the layers in the layout with the flag layer further comprises:

setting graphic (LSM$_{N-1}$) corresponding to a layer just below the N$^{th}$ top layer to be equal to graphic of the (N−1)$^{th}$ layer (ME$_{N-1}$) in the layout; and if graphic (COMM$_k$) and graphic (NO_M$_{k+2}$_BULK) have an intersection, setting graphic (LSM$_k$) to be equal to the graphic (COMM$_k$), otherwise setting the graphic (LSM$_k$) to be empty set, wherein k is an integer greater than 0 and less than N−1;

wherein the graphic (LSM$_k$) indicates the graphic of the layer just below the top layer in the layout.

8. The computer readable recording medium as claimed in claim 1, wherein the step for checking the layout according to the flag layer comprises:

comparing graphic size of the flag layer with a reference size;

if the graphic size of the flag layer is larger than the reference size, performing a large size identified rule; and if the graphic size of the flag layer is smaller than the reference size, performing a small size identified rule.

9. The computer readable recording medium as claimed in claim 8, wherein the large size identified rule comprises:

setting corner graphic of the flag layer as graphic (B_B-COR);

intersecting graphic of the h$^{th}$ layer (ME$_h$) in the layout and the graphic (B_BCOR), and setting a result of the intersecting as graphic (MET$_h$CA), wherein h is an integer greater than 0 and less than N+1, and N is a maximum number of layers in the layout; and checking whether or not there is a part of the graphics not arranged at an angle of 45° in the graphic (MET$_h$CA).

10. A computer readable recording medium storing thereon a program, which causes a computer system to perform a method for checking a layout, the method comprising:

reading the layout, wherein the layout comprises a plurality of layers;

uniting a part of or all the layers in the layout to obtain a flag layer;

comparing the layers with the flag layer;

comparing graphic size of the flag layer with a reference size to determine an identified rule; and generating a check result according to results of comparing the layers with the flag layer and comparing the graphic size of the flag layer with the reference size, for determining whether the layout meets design rule or not according to the check result.

11. The computer readable recording medium as claimed in claim 10, wherein the layout is a GDS (global distribution system) format file.

12. The computer readable recording medium as claimed in claim 10, wherein the flag layer is a union of all the layers in the layout.

13. The computer readable recording medium as claimed in claim 10, wherein the step for comparing the layers with the flag layer comprises:

comparing each of the layers in the layout with the flag layer;

if result of the comparing for a certain layer in the layers with the flag layer is empty set, indicating that said certain layer is an empty layer;

if the result of the comparing for a certain layer in the layers with the flag layer is nonempty set, in the layers with the result of the comparing being nonempty set, the uppermost layer is the top layer in the layout, and other layers below the top layer are the inner layers in the layout.

14. The computer readable recording medium as claimed in claim 13, wherein the step for comparing each of the layers in the layout with the flag layer comprises:

setting graphic (TOPM$_N$) corresponding to an N$^{th}$ top layer to be equal to graphic of the N$^{th}$ layer (ME$_N$) in the layout, wherein N is a maximum number of layers in the layout;

if the flag layer (BULK) and the graphic (TOPM$_N$) have no intersection, setting graphic (NO_M$_N$_BULK) to be equal to graphic of the flag layer (BULK), otherwise setting the graphic (NO_M$_N$_BULK) to be empty set, wherein the graphic (NO_M$_N$_BULK) indicates the graphic of the flag layer without the N$^{th}$ layer;

if graphic of the i$^{th}$ layer (ME$_i$) in the layout and graphic (NO_M$_{i+1}$_BULK) have an intersection, setting graphic (TOPM$_i$) to be equal to the graphic of the i$^{th}$ layer (ME$_i$) in the layout, otherwise setting the graphic (TOPM$_i$) to be empty set, wherein i is an integer greater than 0 and less than N;

if graphic (NO_M$_{i+1}$_BULK) and the graphic (TOPM$_i$) have no intersection, setting graphic (NO_M$_i$_BULK) to be equal to the graphic (NO_M$_{i+1}$_BULK), otherwise setting the graphic (NO_M$_i$_BULK) to be empty set; and uniting the graphics (TOPM$_N$~TOPM$_j$) to obtain the top layer in the layout, wherein j indicates a minimum value of a possible range of the top layer in the layout.

15. The computer readable recording medium as claimed in claim 14, wherein the step for comparing each of the layers in the layout with the flag layer further comprises:

if graphic of the i$^{th}$ layer (ME$_i$) in the layout and the graphic (NO_M$_{i+1}$_BULK) have no intersection, setting graphic (COMM$_i$) to be equal to the graphic of the i$^{th}$ layer (ME$_i$), otherwise setting the graphic (COMM$_i$) to be empty set;

wherein the graphic (COMM$_i$) indicates the graphic of one of layers except the top layer in the layout.

16. The computer readable recording medium as claimed in claim 15, wherein the step for comparing each of the layers in the layout with the flag layer further comprises:

setting graphic ($LSM_{N-1}$) corresponding to a layer just below the $N^{th}$ top layer to be equal to graphic of the $(N-1)^{th}$ layer ($ME_{N\_1}$) in the layout; and if graphic ($COMM_k$) and graphic ($NO\_M_{k+2}\_BULK$) have an intersection, setting graphic ($LSM_k$) to be equal to the graphic ($COMM_k$), otherwise setting the graphic ($LSM_k$) to be empty set, wherein k is an integer greater than 0 and less than N−1;

wherein the graphic ($LSM_k$) indicates the graphic of the layer just below the top layer in the layout.

17. The computer readable recording medium as claimed in claim 10, wherein the step for comparing the graphic size of the flag layer with a reference size to determine the identified rule comprises:

comparing the graphic size of the flag layer with a reference size;

if the graphic size of the flag layer is larger than the reference size, a large size identified rule is selected; and if the graphic size of the flag layer is smaller than the reference size, a small size identified rule is selected.

18. The computer readable recording medium as claimed in claim 17, wherein the large size identified rule comprises:

setting corner graphic of the flag layer as graphic (B_BCOR);

intersecting graphic of the $h^{th}$ layer ($ME_h$) in the layout and the graphic (B_BCOR), and setting a result of the intersecting as graphic ($MET_hCA$), wherein h is an integer greater than 0 and less than N+1, and N is a maximum number of layers in the layout; and checking whether or not there is a part of the graphics not arranged at an angle of 45° in the graphic ($MET_hCA$).

* * * * *